(12) United States Patent
Sun

(10) Patent No.: US 8,433,839 B2
(45) Date of Patent: Apr. 30, 2013

(54) CONNECTOR ASSEMBLY

(75) Inventor: Zheng-Heng Sun, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 62 days.

(21) Appl. No.: 13/274,344

(22) Filed: Oct. 16, 2011

(65) Prior Publication Data

US 2013/0042040 A1    Feb. 14, 2013

(30) Foreign Application Priority Data

Aug. 10, 2011    (CN) .......................... 2011 1 0228057

(51) Int. Cl.
*H05K 7/10*    (2006.01)
(52) U.S. Cl.
USPC .............................. 710/301; 710/314; 710/66

(58) Field of Classification Search .................. 710/301, 710/313–316, 8–14, 62–66
See application file for complete search history.

(56) References Cited

U.S. PATENT DOCUMENTS 8,103,993 B2 * 1/2012 Atherton et al. .............. 716/100

* cited by examiner

*Primary Examiner* — Clifford Knoll
(74) *Attorney, Agent, or Firm* — Altis Law Group, Inc.

(57) ABSTRACT

A connector assembly includes first to fifth connectors, two PCIe slots, and an adapter board. When the first connector is connected to the fifth connector, and the third connector is connected to the fourth connector, signals at the pins of the third connector are transmitted to the second group of pins of the first PCIe slot through the fourth connector, the fifth connector, and the first connector in series. When the second connector is connected to the fifth connector, and the third connector is connected to the fourth connector, signals at pins of the third connector are transmitted to the fourth group of pins of the second PCIe slot through the fourth connector, the fifth connector, and the second connector in series.

2 Claims, 4 Drawing Sheets

CONNECTOR ASSEMBLY

BACKGROUND

1. Technical Field

The present disclosure relates to connectors, and particularly, to a peripheral component interconnect express (PCIe) connector assembly.

2. Description of Related Art

Motherboard slots, such as PCIe connectors, are electrical interfaces used for data transmission between a computer and expansion cards, such as graphics cards. Lanes provided by a chipset on the motherboard are distributed to the slots on the motherboard. However, the lane number of lanes is limited in accordance with the capability of the chipset, and the lanes distributed to a particular slot cannot be used by another slot even when the particular slot is not in use. Therefore, there is room to improvement in the art.

BRIEF DESCRIPTION OF THE DRAWINGS

The components in the drawings are not necessarily drawn to scale, the emphasis instead being placed upon clearly illustrating the principles of a connector assembly. Moreover, in the drawings, like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
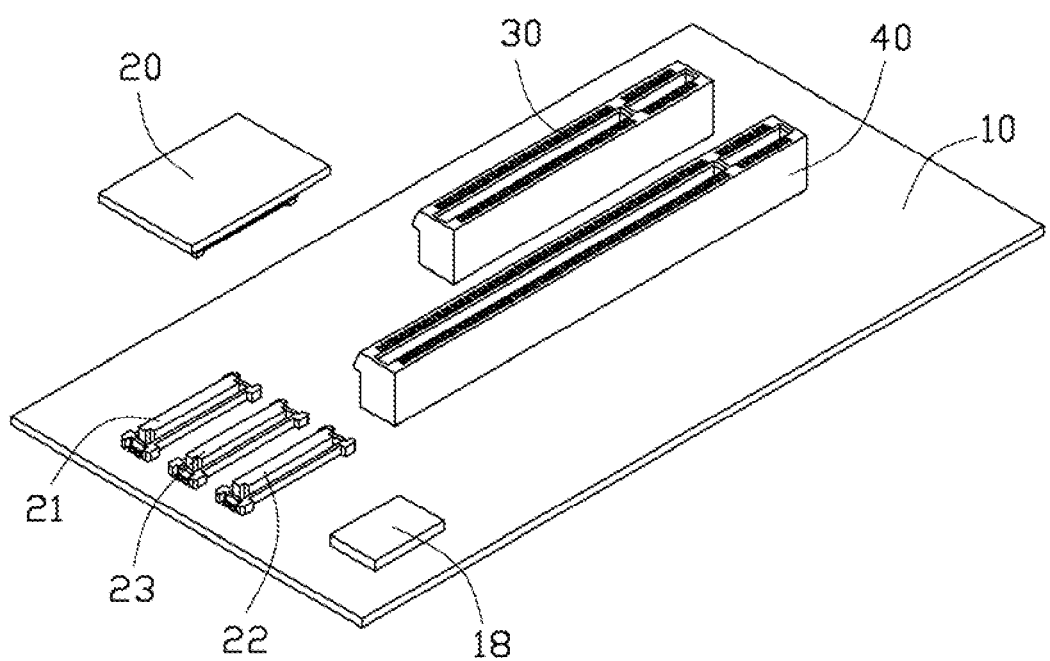
FIG. 1 is an exploded, isometric view of a connector assembly in accordance with an exemplary embodiment, the connector assembly including a jumper board.

Referring to FIG. 1, a connector assembly is mounted on a motherboard 10. An exemplary embodiment of the connector assembly includes a peripheral component interconnection express (PCIe) x8 slot 30, a PCIe x16 slot 40, an adapter card 20, a first connector 21, a second connector 22, and a third connector 23.

Standard PCIe slots can include up to 32 PCIe lanes, termed x1, x4, x16, x32 in respect to the number of physical or electronic lanes. In relation to the physical lanes of the slots, the electrical lanes are provided by a chipset 18 on the motherboard 10. A standard PCIe expansion card can be fitted into a standard PCIe slot with more physical lanes, but cannot be fitted into another standard PCIe slot with less physical lanes. Therefore, larger PCIe slots are sometimes preferred for installation on the motherboard 10 for receiving larger PCIe expansion cards while the electrical lanes actually connected to the slot are less than the physical lanes of the slot. For example, when the motherboard 10 capable of providing 20 PCIe lanes is equipped with a PCIe x4 slot, a PCIe x8 slot, and a PCIe x16 slot. The PCIe x16 slot can only acquire 8 electrical lanes for data transmission while the PCIe x4 slot and the PCIe x8 slot are respectively set up with 4 and 8 electrical lanes, and thus limiting the bandwidth of the PCIe x16 slot.

The standard PCIe slot includes a side A and a side B, who have a number of pins respectively corresponding to the physical lanes. A standard PCIe x1 slot has 18 pins on the side A called A1-A18 and 18 pins on the side B called B1-B18, and the first 13 pins on each side (A1-A13 and B1-B13) are for generic usage, such as power and clock. While the other 5 pins (A14-A18 and B14-B18) correspond to a lane called lane 0 for signal transmission. A standard PCIe x4 slot has 15 more pins (on both sides) called A19-A32 and B19-B32 than the standard PCIe x1 slot, and the 15 pins correspond to lane 1 (A19-A22 and B19-B22), lane 2 (A23-A26 and B23-B26), and lane 3 (A27-A32 and B27-B32). A standard PCIe x8 slot has 17 more pins (on both sides) called A33-A49 and B33-B49 than the standard PCIe x4 slot, and the 17 pins correspond to lane 4 (A33-A36 and B33-B36), lane 5 (A37-A40 and B37-B40), lane 6 (A41-A44 and B41-B44), and lane 7 (A45-A49 and B45-B49). A standard PCIe x16 slot has 33 more pins (on both sides) called A50-A82 and B50-B82 than the standard PCIE x8 slot. The 33 pins correspond to lane 8 (A50-A53 and B50-B53), lane 9 (A54-A57 and B54-B57), lane 10 (A58-A61 and B58-B61), lane 11 (A62-A65 and B62-B65), lane 12 (A66-A69 and B66-B69), lane 13 (A70-A73 and B70-B73), lane 14 (A74-A77 and B74-B77), and lane 15 (A78-A82 and B78-B82).

In the embodiment, the chipset 18 provides 16 electrical lanes. The PCIe x8 slot 30 includes 49 pins on the side A called A1-A49, and 49 pins on the side B called B1-B49. The pins A1-A13 and B1-B13 of the PCIe x8 slot 30 are regarded as a first group of pins of the PCIe x8 slot 30. The pins A14-A49 and B14-B49 of the PCIe x8 slot 30 are regarded as a second group of pins of the PCIe x8 slot 30. The PCIe x16 slot 40 includes 82 pins on the side A called A1-A82, and 82 pins on the side B called B1-B82. The pins A1-A49 and B1-B49 of the PCIe x16 slot 40 are regarded as a first group of pins of the PCIe x16 slot 40. The pins A50-A82 and B50-B82 of the PCIe x16 slot 40 are regarded as a second group of pins of the PCIe x16 slot 40. The pins A1-A13 and B1-B13 of the PCIe x8 slot 30 and the PCIe x16 slot 40 are used to receive power and clock signals from the chipset 18.

In the embodiment, each of the first connector 21, the second connector 22, and the third connector 23 includes 36 pins on a side C called C1-C36, and 36 pins on a side D called D1-D36. The pins A14-A49 and B14-B49 of the PCIe x8 slot 30 are respectively connected to the pins C1-C36 and D1-D36 of the first connector 21. The pins A14-A49 and B14-B49 of the PCIe x16 slot 40 are connected to the chipset 18, for acquiring 8 electrical lanes for data transmission from the chipset 18. The pins A50-A82 and B50-B82 of the PCIe x16 slot 40 are respectively connected to the pins C1-C3, C5-C16, C19-C36, D1-D5, D7-D18, and D21-D36 of the second connector 22. The pins C4, C17, C18, D6, D19, and D20 of the second connector 22 are idle. The pins C1-C36 and D1-D36 of the third connector 23 are connected to the chipset 18. Pins of the third connector 23 are connected to the chipset 18, for acquiring 8 electrical lanes for data transmission from the chipset 18.

Figure 2:
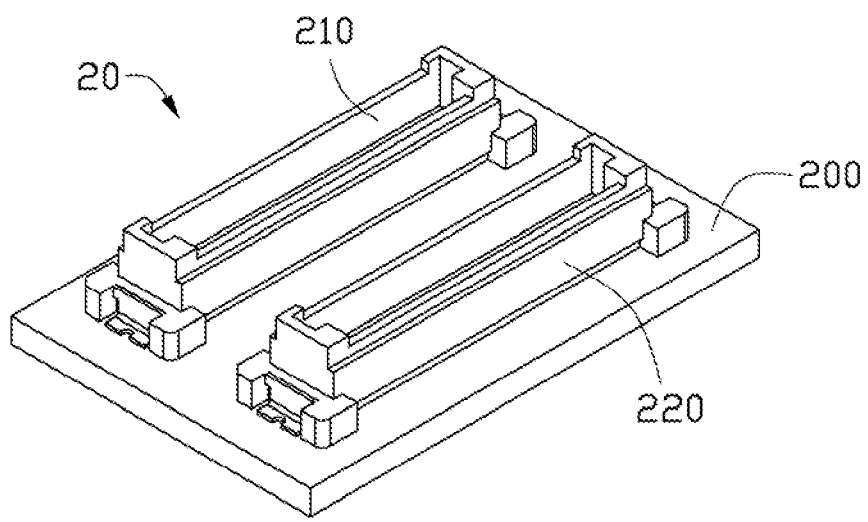
FIG. 2 is an inverted, isometric view of the jumper board of FIG. 1.

Referring to FIG. 2, the adapter board 20 includes a printed circuit board 200, and a fourth connector 210 and a fifth connector 220 set on the printed circuit board 200. The pins of the fourth connector 210 and the fifth connector 220 are connected respectively. When the first connector 21, the second connector 22, or the third connector 23 is connected to the fourth connector 210, the pins of the first connector 21, the second connector 22, or the third connector 23 are respectively connected to the pins of the fourth connector 210. When the first connector 21, the second connector 22, or the third connector 23 is connected to the fifth connector 220, the pins of the first connector 21, the second connector 22, or the third connector 23 are respectively connected to the pins of the fifth connector 220.

Figure 3:
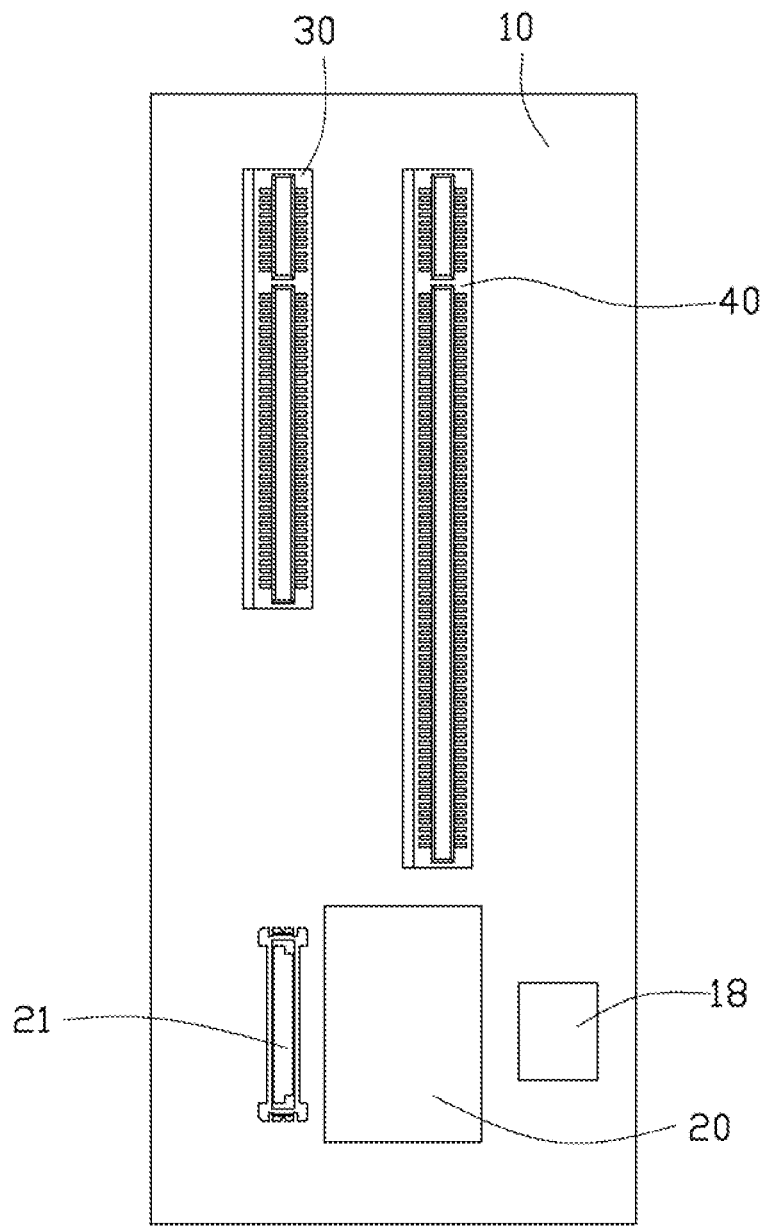
FIGS. 3 and 4 are top plan views of the connector assembly of FIG. 1, but shows different states of use.

Referring to FIG. 3, when a PCIe x16 expansion card is plugged into the PCIe x16 slot 40, and the PCIe x8 slot 30 is idle, the fourth connector 210 is connected to the third connector 23, and the fifth connector 220 is connected to the second connector 22. As a result, signals at the pins of the third connector 23 are transmitted to the pins A50-A82 and B50-B82 of the PCIe x16 slot 40 through the fourth connector 210, the fifth connector 220, and the second connector 22 in series. At this time, the PCIe x16 expansion card plugged into the PCIe x16 slot 40 acquires 16 electrical lanes for data transmission from the chipset 18.

Figure 4:
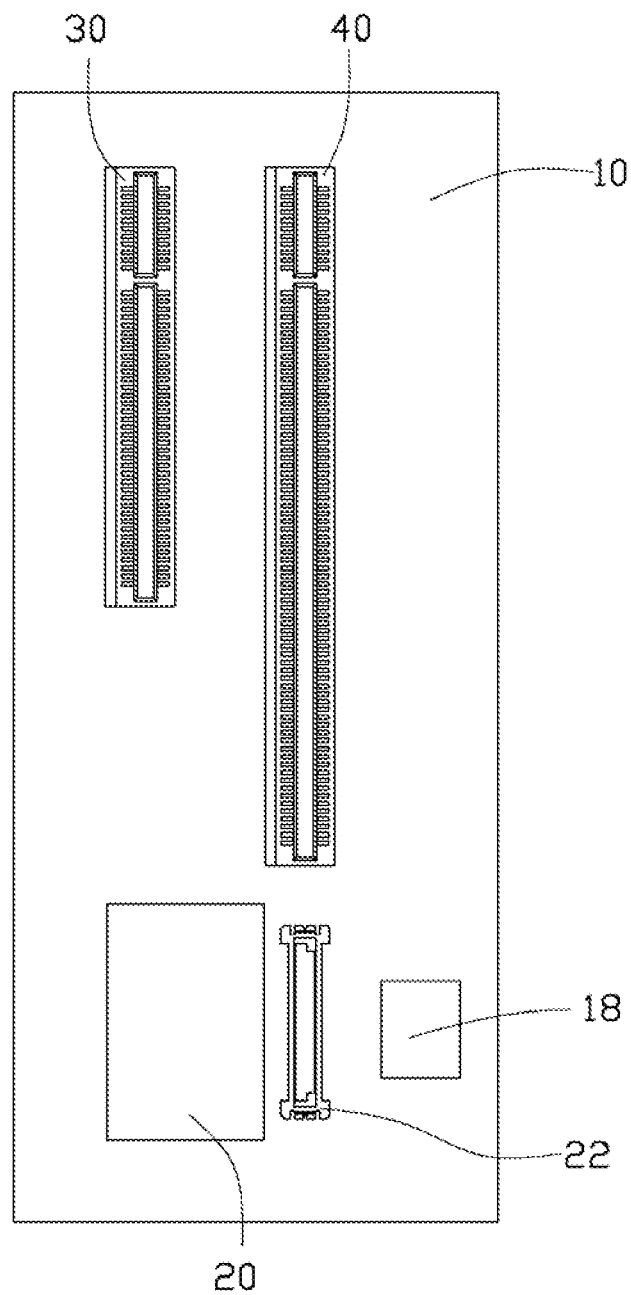

Referring to FIG. 4, when a PCIe x8 expansion card is plugged into the PCIe x8 slot 30, the fourth connector 210 is connected to the third connector 23, and the fifth connector 220 is connected to the first connector 21. As a result, signals at the pins of the third connector 23 are transmitted to the pins A50-A82 and B50-B82 of the PCIe x16 slot 40 through the fourth connector 210, the fifth connector 220, and the first connector 21 in series. At this time, each of two expansion cards respectively plugged into the PCIe x8 slot 30 and the PCIe x16 slot 40 acquires 8 electrical lanes for data transmission from the chipset 18.

The foregoing description of the exemplary embodiments of the disclosure has been presented only for the purposes of illustration and description and is not intended to be exhaustive or to limit the disclosure to the precise forms disclosed. Many modifications and variations are possible in light of everything above. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A connector assembly comprising:
a first connector mounted on a motherboard;
a second connector mounted on the motherboard;
a third connector mounted on the motherboard, wherein pins of the third connector are connected to a chipset of the motherboard for receiving signals from the chipset;
a first PCIe slot comprising a first group of pins connected to the chipset for receiving signals from the chipset, and a second group of pins connected to the first connector;
a second PCIe slot comprising a third group of pins connected to the chipset for receiving signals from the chipset, and a fourth group of pins connected to the second connector; and
an adapter board comprising a fourth connector and a fifth connector, wherein pins of the fourth and fifth connectors are connected together; when the fifth connector is connected to the first connector, and the fourth connector is connected to the third connector, signals at pins of the third connector are transmitted to the second group of pins of the first PCIe slot through the fourth connector, the fifth connector, and the first connector in series; when the fifth connector is connected to the second connector, and the fourth connector is connected to the third connector, signals at pins of the third connector are transmitted to the fourth group of pins of the second PCIe slot through the fourth connector, the fifth connector, and the second connector in series.

2. The connector assembly of claim 1, wherein the first PCIe slot is a PCIe x8 slot, the first group of pins of the PCIe x8 slot comprise first to thirteen pins on a first side and first to thirteen pins on a second side, the second group of pins of the PCIe x8 slot comprise fourteen to forty-ninth pins on the first side and fourteen to forty-ninth pins on the second side; the first connector comprises first to thirty-sixth pins on a first side and first to thirty-sixth pins on a second side; the fourteen to forty-ninth pins on the first side of the first PCIe slot are connected to the first to thirty-sixth pins on the first side of the first connector, and the fourteen to forty-ninth pins on the second side of the first PCIe slot are connected to the first to thirty-sixth pins on the second side of the first connector; wherein the third group of pins of the second PCIe slot comprise first to forty-ninth pins on a first side and first to forty-ninth pins on a second side, the fourth group of pins of the second PCIe slot comprise fiftieth to eighty-second pins on the first side and fiftieth to eighty-second pins on the second side; the second connector comprises first to thirty-sixth pins on a first side and first to thirty-sixth pins on a second side; the first to third pins, the fifth to sixteen pins, the nineteen to thirty-sixth pins on the first side of the second connector are connected to the fiftieth to eighty-second pins on the first side of the second PCIe slot, and the first to fifth pins, the seventh to eighteenth pins, the twenty-first to thirty-sixth pins on the second side of the second connector are connected to the fiftieth to eighty-second pins on the second side of the second PCIe slot.

* * * * *